(12) United States Patent
Ovsiannikov et al.

(10) Patent No.: US 9,411,726 B2
(45) Date of Patent: Aug. 9, 2016

(54) LOW POWER COMPUTATION ARCHITECTURE

(71) Applicant: Samsung Electronics Co., Ltd., Suwon-si, Gyeonggi-do (KR)

(72) Inventors: Ilia Ovsiannikov, Studio City, CA (US); Zhengping Ji, Pasadena, CA (US); Yibing Michelle Wang, Temple City, CA (US); Hongyu Wang, San Gabriel, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/712,884

(22) Filed: May 14, 2015

(65) Prior Publication Data

US 2016/0093343 A1 Mar. 31, 2016

Related U.S. Application Data

(60) Provisional application No. 62/058,077, filed on Sep. 30, 2014.

(51) Int. Cl.
*G06F 7/38* (2006.01)
*G06F 12/08* (2016.01)
*G06T 1/20* (2006.01)
*G11C 7/10* (2006.01)

(52) U.S. Cl.
CPC ............ *G06F 12/0802* (2013.01); *G06T 1/20* (2013.01); *G11C 7/1039* (2013.01); *G11C 7/1069* (2013.01)

(58) Field of Classification Search
CPC ..... G06F 7/5443; G06F 7/57; G06F 9/30014; G06F 9/30036; G06F 2207/3828
USPC .................................................. 708/523–524
See application file for complete search history.

(56) References Cited

U.S. PATENT DOCUMENTS

| | | | | | |
|---|---|---|---|---|---|
| 4,541,048 | A | * | 9/1985 | Propster | G06F 11/2051 708/524 |
| 4,943,912 | A | * | 7/1990 | Aoyama | G06F 15/8015 708/524 |
| 5,235,536 | A | * | 8/1993 | Matsubishi | G06F 7/544 708/524 |
| 5,301,340 | A | * | 4/1994 | Cook | G06F 9/3012 708/524 |
| 5,442,580 | A | * | 8/1995 | Fettweis | G06F 7/5443 708/524 |
| 6,611,856 | B1 | * | 8/2003 | Liao | G06F 7/5443 708/523 |
| 7,640,285 | B1 | * | 12/2009 | Oberman | G06F 7/57 708/272 |

(Continued)

OTHER PUBLICATIONS

Farabet et al., "Hardware Accelerated Convolutional Neural Networks for Synthetic Vision Systems," Circuits and Systems (ISCAS), Proceedings of 2010 IEEE International Symposium, May 30, 2010-Jun. 2, 2010, 4 pages.

(Continued)

*Primary Examiner* — Tan V. Mai
(74) *Attorney, Agent, or Firm* — Renaissance IP Law Group LLP

(57) ABSTRACT

An embodiment includes a system, comprising a first memory; a plurality of first circuits, wherein each first circuit is coupled to the memory; and includes a second circuit configured to generate a first output value in response to an input value received from the first memory; and an accumulator configured to receive the first output value and generate a second output value; and a controller coupled to the memory and the first circuits, and configured to determine the input values to be transmitted from the memory to the first circuits.

16 Claims, 15 Drawing Sheets

(56) References Cited

U.S. PATENT DOCUMENTS

| | | | |
|---|---|---|---|
| 8,510,244 B2 | 8/2013 | Carson et al. | |
| 8,634,476 B2 | 1/2014 | Tran | |
| 8,644,643 B2 | 2/2014 | Jiao et al. | |
| 2002/0002574 A1* | 1/2002 | Jennings, III | G06F 15/7817 708/520 |
| 2002/0143838 A1* | 10/2002 | Magoshi | G06F 7/5443 708/524 |
| 2014/0067889 A1* | 3/2014 | Mortensen | G06F 7/57 708/201 |
| 2014/0192066 A1 | 7/2014 | Savransky et al. | |

OTHER PUBLICATIONS

Krizhevsky et al., "ImageNet Classification with Deep Convolutional Neural Networks," Advances in Neural Information Processing Systems 25 (NIPS 2012), 9 pages.

* cited by examiner

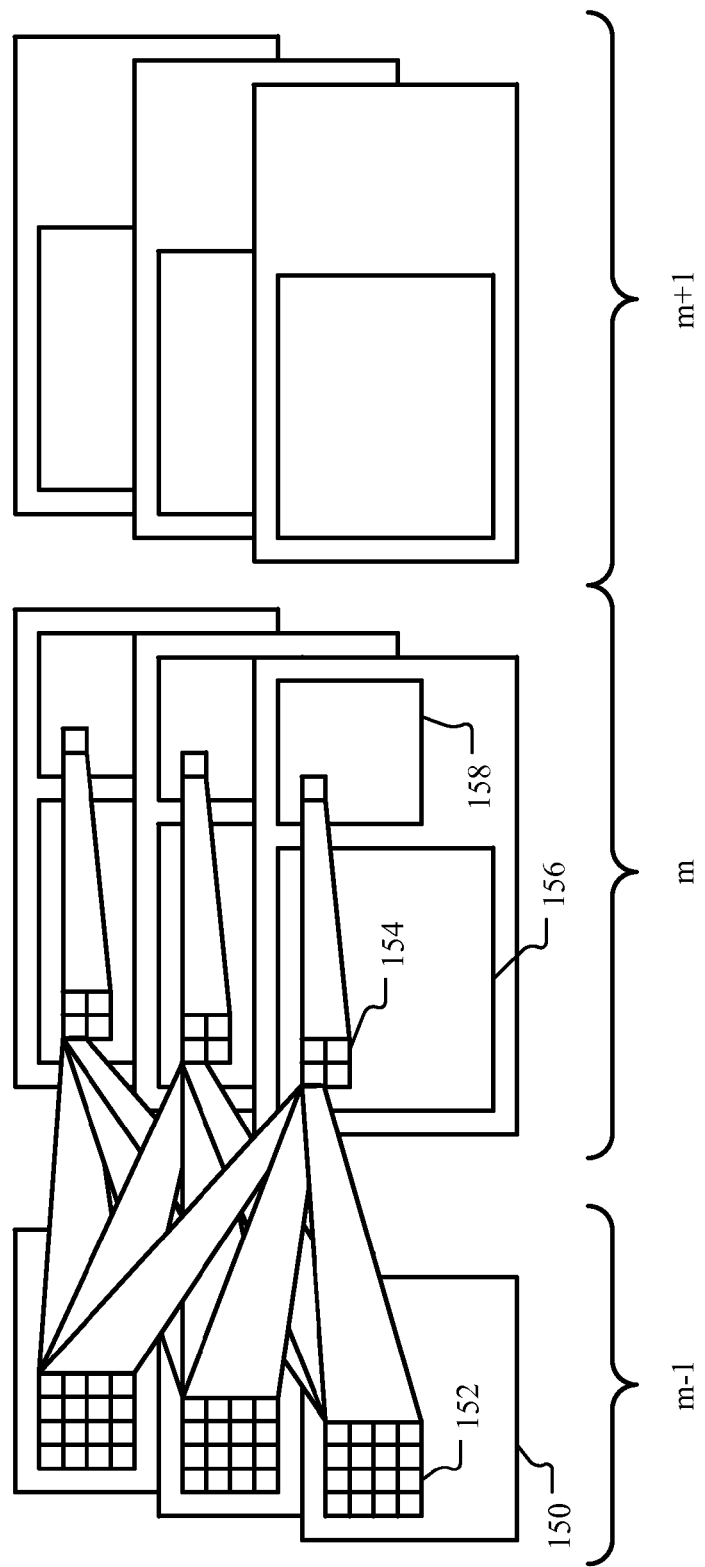

LOW POWER COMPUTATION ARCHITECTURE

CROSS-REFERENCE TO RELATED APPLICATIONS

This application claims the benefit of U.S. Provisional Patent Application No. 62/058,077, filed Sep. 30, 2014, which is hereby incorporated by reference herein, in its entirety, for all purposes.

BACKGROUND

This disclosure relates to computation architectures and, in particular to low power computation architectures.

General purpose processors may be programmable to perform complex calculations. However, because of the general purpose nature, such processors may consume more power and perform at a lower speed, especially for calculations involving increased parallelism. Graphics processing units (GPUs) may be configured to perform faster than general purpose processors; however, the increased performance is accompanied by higher power consumption. Higher power solutions may negatively impact performance of a mobile device.

SUMMARY

An embodiment includes a system, comprising a first memory; a plurality of first circuits, wherein each first circuit is coupled to the memory; and includes a second circuit configured to generate a first output value in response to an input value received from the first memory; and an accumulator configured to receive the first output value and generate a second output value; and a controller coupled to the memory and the first circuits, and configured to determine the input values to be transmitted from the memory to the first circuits An embodiment includes a system, comprising a first memory configured to store data; a plurality of second memories coupled to the first memory, each second memory configured to cache a portion of the data of the first memory including a plurality of values; and an output circuit configured to output data from at least two of the second memories substantially simultaneously.

An embodiment includes a system, comprising a first memory; a plurality of circuits, wherein each circuit is coupled to the memory; and includes a look-up-table configured to generate a first output value in response to an input value received from the first memory; and an accumulator configured to receive the first output value and generate a second output value; and a controller coupled to the memory and the circuits, and configured to determine the input values to be transmitted from the memory to the first circuits.

BRIEF DESCRIPTION OF SEVERAL VIEWS OF THE DRAWINGS

FIG. 1C is a schematic view of an operation according to an embodiment.

DETAILED DESCRIPTION

Figure 1A:
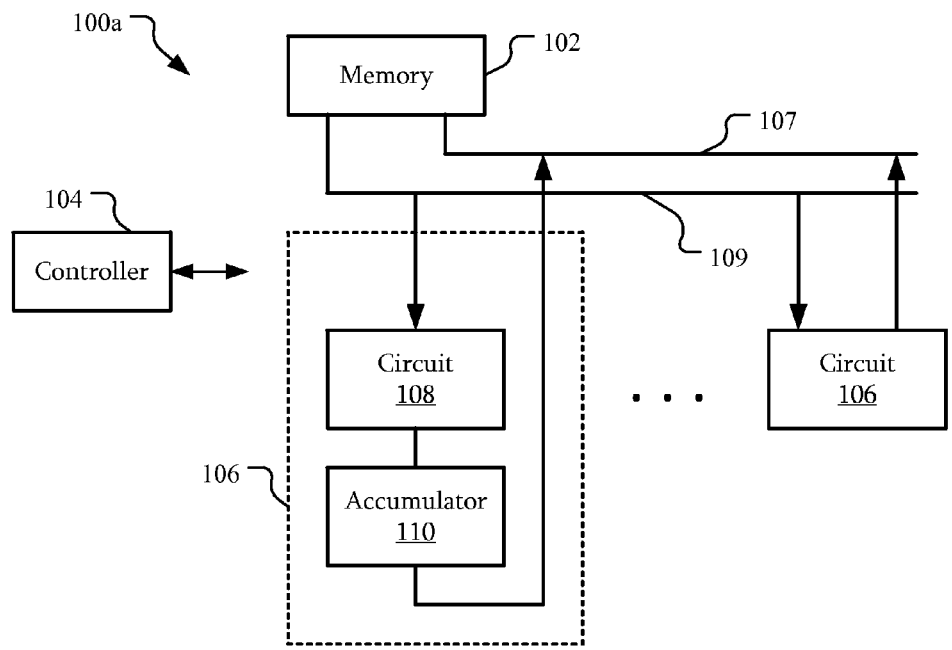
FIGS. 1A-1B are schematic views of system according to some embodiments.

The embodiments relate to computation architectures and, in particular to low power computation architectures. The following description is presented to enable one of ordinary skill in the art to make and use the embodiments and is provided in the context of a patent application and its requirements. Various modifications to the exemplary embodiments and the generic principles and features described herein will be readily apparent. The exemplary embodiments are mainly described in terms of particular methods and systems provided in particular implementations.

However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of this disclosure. The exemplary embodiments will also be described in the context of particular methods having certain steps. However, the method and system operate effectively for other methods having different and/or additional steps and steps in different orders that are not inconsistent with the exemplary embodiments. Thus, embodiments are not intended to be limited to the particular embodiments shown, but are to be accorded the widest scope consistent with the principles and features described herein.

The exemplary embodiments are described in the context of particular system having certain components. One of ordinary skill in the art will readily recognize that embodiments are consistent with the use of systems having other and/or additional components and/or other features. Embodiments are also described in the context of single elements. However, one of ordinary skill in the art will readily recognize that the method and system are consistent with the use of systems having multiple elements.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Figure 1B:
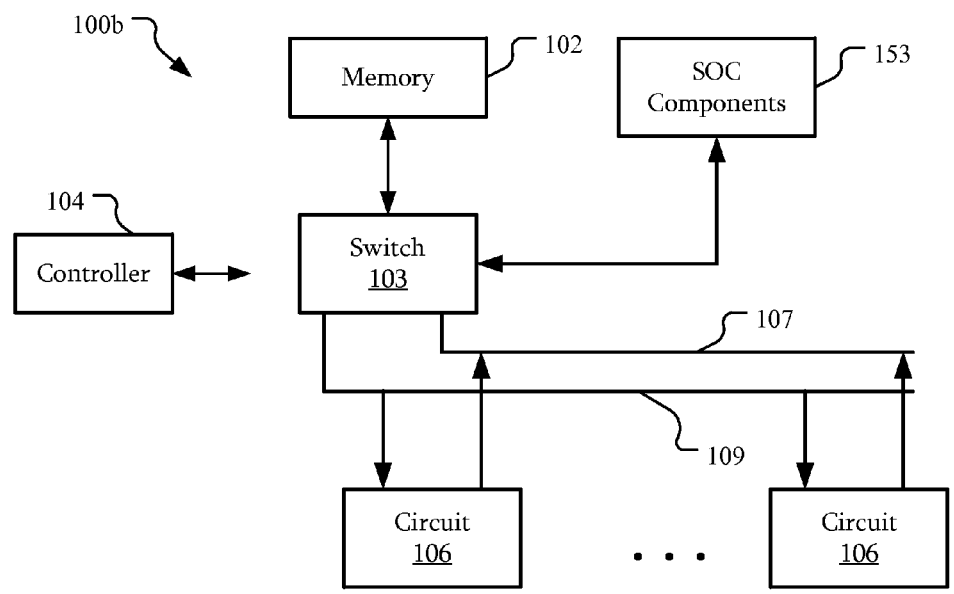

FIGS. 1A-1B are schematic views of system according to some embodiments. Referring to FIG. 1A, in this embodiment, the system 100a includes a memory 102, a controller 104, and multiple circuits 106.

The memory 102 may include any type of memory. For example, the memory 102 may include dynamic memory, static memory, flash memory, magnetic memory, volatile memory, non-volatile memory, or the like. The memory 102 is coupled to an input bus 107 and an output bus 109. The memory 102 is configured transmit and receive data to and from the circuits through the input bus 107 and the output bus 109. Although only one input bus 107 and one output bus 109 have been used as an example, any number of input busses 107 and output busses 109 may be present. Moreover, the number of input busses 107 may, but need not match the number of output busses 109. Although a discrete input bus 107 and a discrete output bus 109 have been used as an example, in other embodiments, a common bus or busses may be used.

The controller 104 may include a variety of devices. For example, the controller 104 may include a general purpose processor, an application specific circuit, discrete logic devices, programmable logic devices, or the like. The controller 104 may be configured to control operations of the various components, such as the memory 102 and the circuits 106. For clarity, the connections between the controller 104 and such components are not illustrated.

Here, an example of internal portions of a circuit 106 is illustrated for one circuit 106. For clarity the same internal portions of other circuits 106 are not illustrated; however, such portions may be similar to those illustrated.

The circuits 106 are coupled to the memory 102. In this embodiment, the circuits 106 are each coupled to the input bus 107 and the output bus 109. Accordingly, the circuits 106 are configured to receive data from the memory 102 and transmit data to the memory 102.

The circuits 106 include a second circuit 108 configured to perform an operation on the input data from the memory 102. The output of the operation may be stored in an accumulator 110. Although a second circuit 108 and an accumulator 110 have been used as examples, as will be described in further detail below, circuits 106 may include other components.

Referring to FIG. 1B, the system 100b may be similar to the system 100a of FIG. 1A. In this embodiment, the circuits 106 are coupled to a switch 103. The switch 103 may be configured to route data between the memory 102 and the circuits 106. In addition, the switch 103 may be configured to route data between one or more circuits 106 to other circuits, including one or more of the circuits 106 outputting the data. Furthermore, the switch 103 may be configured to route data between the memory 102, the circuits 102 and other components. System-on-chip (SOC) components 153 have been used as an example of other components. However, in other embodiments other than SOC applications, corresponding different components may be present.

In an embodiment, the controller 104 may be configured to establish routes for data through the switch 103 depending on a particular calculation being performed. For example, a particular calculation may include a first calculation on a first set of data and a second calculation based on a result of the first calculation. The controller 104 may be configured to configure the switch 103 such that data from the memory 102 is routed to a first set of circuits 106 configured to calculate the first calculation. In addition, the controller 104 may be configured to configure the switch 103 such that outputs of the circuits 106 that calculated the first calculation are routed to a second set of circuits 106. The controller 104 may also be configured to configure the switch 103 such that outputs of the second set of circuits 106 may be routed to the memory 102, other circuits 106, or another destination. Although two stages of circuits 106 have been used as an example, any number of stages may be used. Furthermore, the controller 104 may be configured to configure the switch 103 such that the output of the memory 102 and the outputs of the circuits 106 may be routed to multiple destinations.

Furthermore, the controller 104 may be configured to configure the circuits 106. For example, the controller 104 may be configured to cause constants, weights, look-up-table values, or the like to be transmitted and/or stored in the circuits 106. Moreover, the controller 104 may be configured to form the connections between the memory 102, circuits 106, or the like. In addition, the controller 104 may be configured to control how data is streamed from the memory 102, such as starting and stopping data streaming, allocating memory space to save streamed data, or the like.

FIG. 1C is a schematic view of an operation according to an embodiment. Referring to FIGS. 1B and 1C, in an embodiment, the operation performed by a circuit 106 may be part of a convolution. In an embodiment, classification algorithms utilizing convolutional networks may use large amounts of calculations. Such networks may be less suitable for use in mobile battery-powered devices such as smartphones and tablets where limited power and battery life are concerns. However, with an architecture described herein, a lower power may be achieved. As a result, real-time computation of convolutional networks may be performed by a mobile processor while maintaining battery life within an acceptable range. The lower power may be achieved by using reduced resolution, while maintaining an acceptable level of recognition performance, using embedded parallel cached memory, and/or using lightweight arithmetic units.

A convolutional network is a class of algorithms that may be used for pattern recognition. For example, a convolutional network can be used to recognize objects in image, human speech and human motion. The input to a convolutional network can be an image, an array of features computed from a sound recording or motion sensors respectively. Such a processor may be used in smartphones, tablets, or the like for tasks including real-time image classification, speech and motion recognition.

A convolutional network may be organized into multiple layers. Here, examples of layers m−1, m, and m+1 are illustrated; however, any number of layers may be used. Each layer may contain one or more "maps" or images, which are representations of information in the previous layer. To compute a map, each layer may perform 3 steps: a convolution, a non-linear transform, and pooling.

In convolution, a Krow×Kcol kernel window scans maps, input vectors, images, or the like in the previous layer performing a multiply-accumulate operation with the convolution kernel weights. Convolution results from multiple input maps are added together. A circuit 106 may be configured to perform such convolution to generate a pixel of a map in a current layer m based on one or more maps of a previous layer, layer m−1. Another circuit 106 may be configured to perform a non-linear operation on the pixels of the newly generated map in layer m. Another circuit 106 may be configured to perform the pooling operation to reduce a resolution of a map in layer m.

In particular, one or more circuits 106 may be configured to operate as a convolution multiply-accumulate arithmetic unit. The data stored in the memory 102 may be data representing pixels of an image or map. Here, in layer m−1, multiple maps 150 have multiple pixels. The circuit 106 may be configured to multiply an input pixel stream from the memory 102 by cached weights, accumulate weighted values and output a result when each convolution completes. The output may be stored in a pixel 154 of a map 156 in another layer m. The result of the operation may be output to the memory 102 and/or another circuit 106. That is, the map 156 or other maps may be stored in the memory 102 and/or may exist as a stream of data passing through the circuits 106.

Although convolution has been used as an example of an operation associated with a circuit 106, a circuit 106 may be configured to perform other operations. For example, a circuit 106 may be configured to perform a pooling operation. A pooling operation is represented by the change from map 156 to map 158. In particular, the circuit 106 may be configured to calculate an average, a maximum, a selection, or perform other operations on portions of an input pixel stream and output the result when the pooling operation completes. In this example, four pixels of map 156 are pooled into one pixel of map 158. In an embodiment, the source of the pixel stream may be the memory 102; however, in other embodiments, the source may be other circuits 106.

In another example, the circuit 106 may be configured to perform a non-linear operation. In a particular example, the non-linear operation may include a logistic sigmoid applied to each input streamed pixel. The circuit 106 may again be configured to output the result to the memory 102 and/or other circuits 106. In this example, a non-linear operation may be performed on the map 156. As this operation may be performed using only a single pixel input, the operation is represented as being performed in place on the map 156 before the pooling. However, as such an operation may only use a single pixel as an input such an operation may be performed by a circuit 106 to pre-process a stream before pooling or post-process a stream after convolution.

Although several examples of different functions have been given, other functions may be performed. For example, multiplication of a matrix by a scalar, multiplying a scalar by a constant, summing an array, element-wise multiplications, element-wise adding, matrix multiplication, matrix addition or other operations may be implemented using one or more circuits.

Another layer, layer m+1 is illustrated. Similar or different operations may be performed using outputs of layer m as inputs to operations to generate the maps or images of layer m+1. However, such operations are not illustrated to focus on the operations between layer m−1 and layer m. Moreover, any number of layers may be present. Thus, data may be routed through the memory 102, circuits 106, or the like to achieve calculations associated with such multiple layers.

In an embodiment, the operations performed by the circuits 106 may be performed on streams of data. For example, the memory 102 may be configured to stream data, such as pixels of a row of an image, to various circuits. The circuits 106 may, in turn, be configured to output another stream of data/pixels. This stream may be an input to another circuit 106 or group of circuits that generate another stream.

The memory 102 may be configured to output a rasterized image stream through the output bus 107 or the switch 103, pixel after pixel, into circuits 106. In an embodiment, one pixel may be written into a group of circuits 106 in parallel. Although the output of an image has been used as an example, other forms of data may be output by the memory 102 to the circuits 106. For example, data may be written to the circuits 106 that represent weights for convolution, scale factors, constants, look-up-table values, or the like.

The circuits 106 may be configured to output results in a stream to the input bus 109, to the switch 103, or the like. The outputs can then be saved to the memory 102 or redirected by the switch 103 for immediate processing by another set of circuits 106.

In a particular embodiment, the circuits 106 may include only the circuitry configured to perform a particular operation. As will be described in further detail below, a circuit 106 may merely include a multiplier, a memory, and an accumulator. Thus the circuit 106 would be able to calculate a convolution. Additional functions, a programmable core, a general arithmetic logic unit, or the like may be omitted. Accordingly, the overhead with such additional features may be reduced if not eliminated.

In an embodiment, reduction of power consumption associated with numerical computation may lower overall power consumption. Convolutional neural network computation involves multiplication of neuron weights and neuron inputs, neuron output pooling and neuron output non-linear transform, where the amount of multiplications and associated power consumption may dominate over the amount of calculations and power associated with pooling and non-linear transforms.

Power consumption associated with multiplication can be reduced by decreasing a bit width of the input factors, such as neuron weights and neuron inputs. In an embodiment, better classification performance can be achieved by using a non-linear encoding for some input factors, such as weights, such that the input factor does not directly correspond to the original input factor having a lower resolution.

As will be explained later in the disclosure, we use this property of convolutional networks to design a processor that performs calculations with reduced accuracy to save power consumption.

Figure 2:
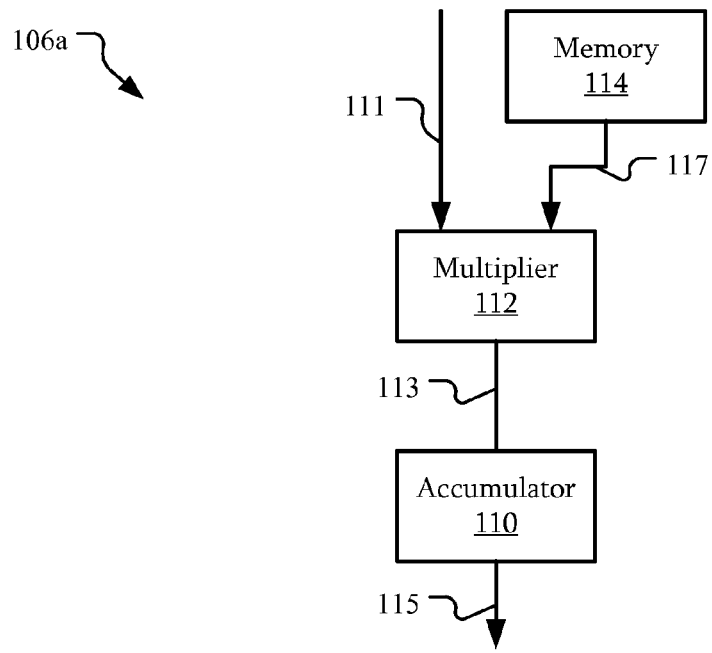
FIGS. 2-8 are schematic views of circuits according to various embodiments.

FIGS. 2-8 are schematic views of circuits according to various embodiments. Referring to FIG. 2, in this embodiment a circuit 106a includes a multiplier 112, an accumulator 110, and a memory 114. Although not illustrated for clarity, an interface to a controller, such as controller 104 of FIG. 1A or 1B, a local controller responsive to the controller 104, or the like may be present. Such an interface, local controller, or the like may be configured to control various parts of the circuit 106a.

The memory 114 may be configured to store values. The memory may be a set of registers, static memory, dynamic memory, or the like. Any circuit that may store values may be used as the memory 114. The multiplier 112 may be configured to multiply an input value 111 by a value 117 output from the memory 114. The product 113 may be stored in the accumulator 110, added to an existing value in the accumulator 110, or the like. The value of the accumulator 110 may be output as value 115.

In a particular example, this circuit 106a may be configured to perform a multiply and accumulate function as part of a convolution. The memory 114 may be configured to store weights for the convolution. The appropriate weight may be output as value 117 from the memory when the corresponding value is present as the input value 111. The accumulator 110 may be configured to create a running sum of the products 113 for different value and weight combinations. Once all of the products of the associated convolution have been performed, the output value 115 may be generated representing a value of the result of the convolution.

Figure 3:
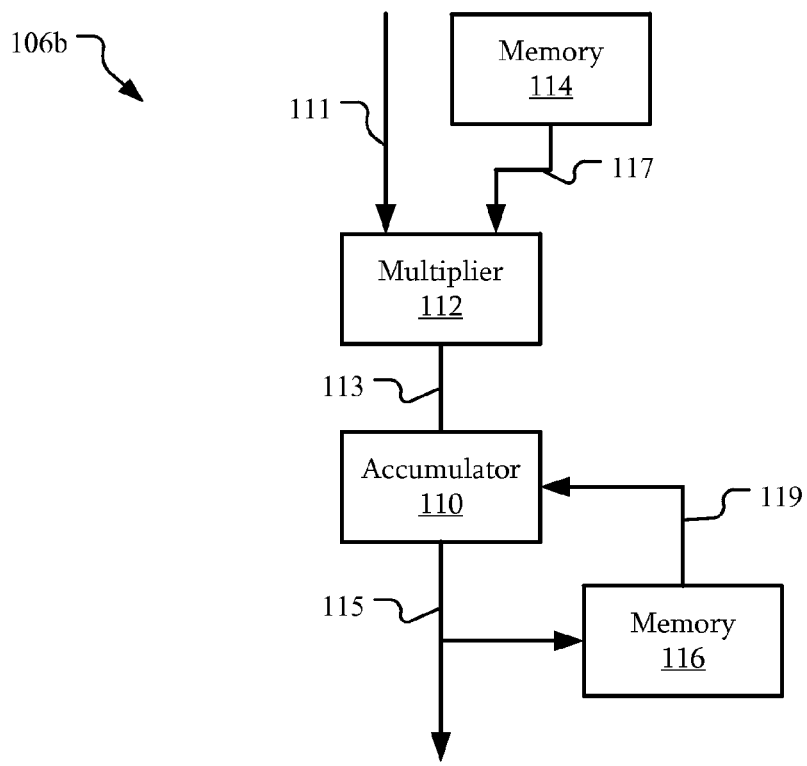

Referring to FIG. 3, in this embodiment, the circuit 106b is similar to the circuit 106a of FIG. 2; however, the circuit 106b includes another memory 116. The memory 116 may be any type of memory similar to the memory 114; however, the memory 116 may be different from the memory 114. The memory 116 may be coupled to the accumulator 110 and configured to store outputs of the accumulator 110. The accumulator 110 may be configured to load values from the memory 116.

In an embodiment, the memory 116 may be configured to store accumulated values during a calculation associated with a convolution. In particular, all of the products associated with a value of the convolution may not have been performed at a point in time. The value 115 representing the partial sum accumulated in the accumulator 110 may be stored in the memory 116. Once additional products associated with that value of the convolution are available, the accumulator 110 may be loaded with a value 119 that was the partial sum stored in the memory 116. The additional products may be added to the partial sum in the accumulator 110 until all of the products associated with the value of the convolution have been accumulated. The final value may then be output as the output value 115 from the circuit 106b.

Although the memory 114 and the memory 116 are illustrated as separate, the memories 114 and 116 may be combined together. Thus, in an embodiment, a single memory may be configured to store weights for a convolution and the running accumulated values, or perform other storage functions that the memories 114 and 116 would separately perform.

Figure 4:
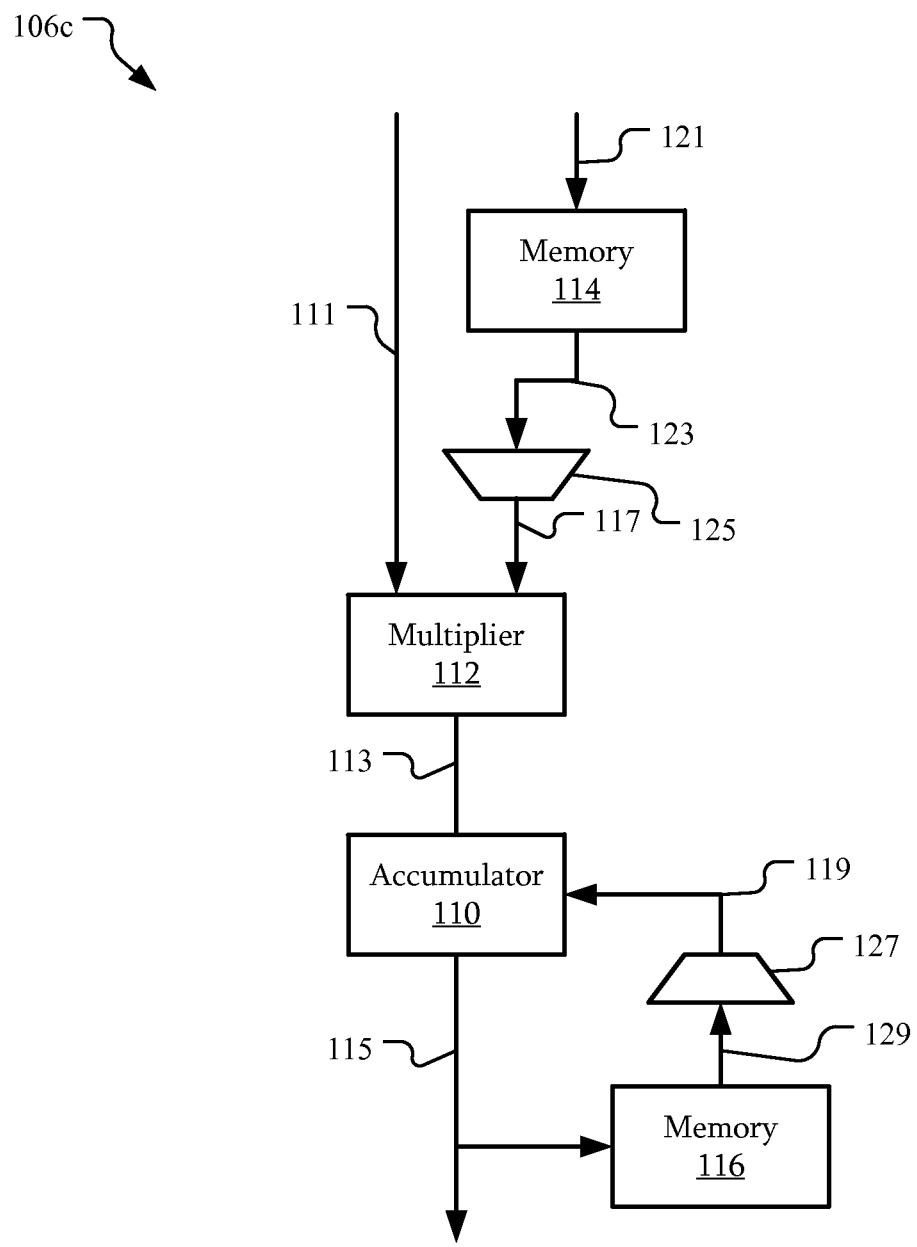

Referring to FIG. 4, in this embodiment the circuit 106c may be similar to the circuit 106b of FIG. 3. However, in this embodiment, the circuit 106c includes a multiplexer 125 and a multiplexer 127. The multiplexer 125 is configured to select a value 117 from the values 123 stored in the memory 114. Similarly, the multiplexer 127 is configured to select a value 119 from values 129 stored in the memory 116.

In an embodiment, the selection of the values by the multiplexers 125 and 127 may be controlled by the controller 102 as described above. Using the calculation of a value associated with a convolution as an example, for a given input value 111, the controller 102 may be configured to select an appropriate value from the memory 114 using the multiplexer 125 as the value 117 that is the weight associated with the input value 111. The controller 102 may be configured to select a value from the memory 116 using the multiplexer 127 as the value 119 to be loaded into the accumulator 110 that is the partial sum associated with the convolution associated with the value 111.

In an embodiment, the memory 114 may be configured to receive values 121, such as through a bus, from a switch, or the like as described above. Accordingly, the values in the memory 114 may be customized for various operations.

Figure 5:
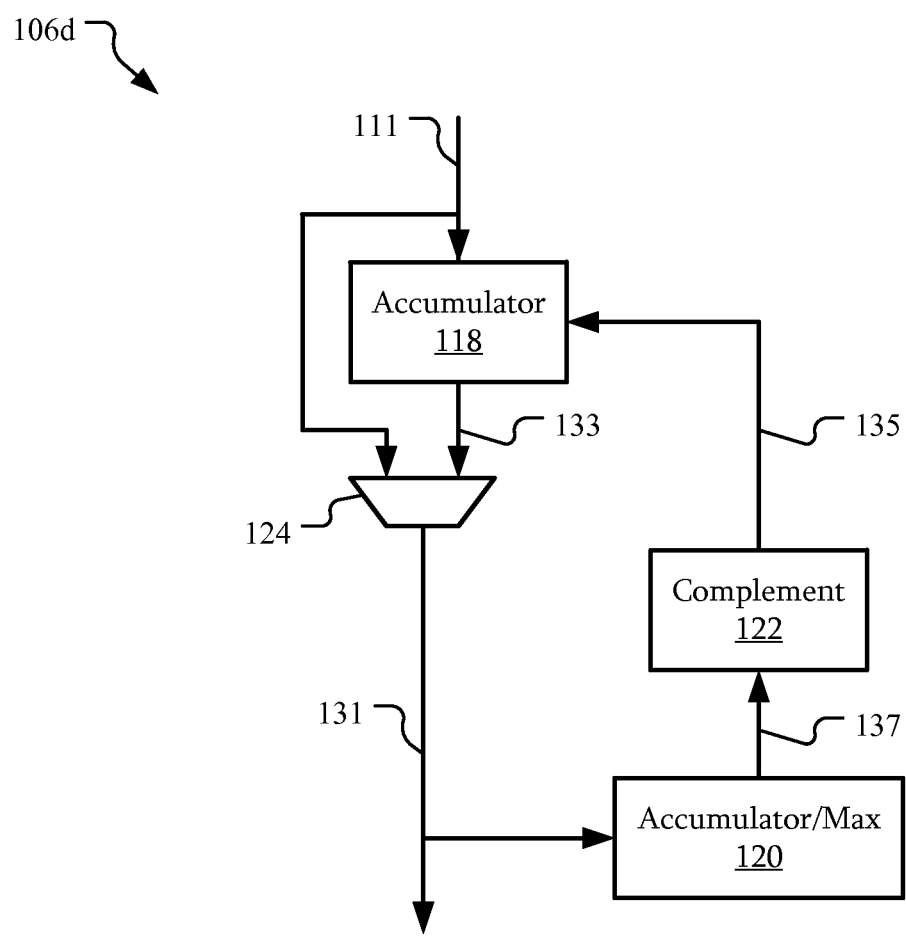

Referring to FIG. 5, in this embodiment, the circuit 106d may include an accumulator 118, a multiplexer 120, an accumulator/max circuit 120, and a complement circuit 122. The accumulator 118 may be configured to accumulate an input value 111. The accumulator may be configured to output a value 133. The multiplexer 124 may be configured to receive the input value 111 and the output value 133 from the accumulator 118. The multiplexer 124 may be configured to select from between these values 133 and 111 for the output value 131. The accumulator/max circuit 120 may be configured to store an accumulated value or a maximum value. A value 137 from the accumulator/max circuit 120 may be output to the complement circuit 122. The complement circuit 122 may be configured to generate value 135 that is the complement of the value 137. The complement circuit 133 may also be configured to pass the value 137 as the value 135. The accumulator 118 may be configured to load the value 135.

In an embodiment, the circuit 106d may be used to perform a pooling function. For example, as input values 111 to be pooled are streamed to the circuit 106, the values may be added in the accumulator 118. If another calculation is to be performed before all values 111 of a present calculation have been added, the partial sum may be stored in the accumulator/max circuit 120. The partial sum may then be loaded into the accumulator 118 at the appropriate time to continue summing with associated input values 111. Accordingly, a sum, average, or the like of a range of input values 111 may be generated.

In another embodiment, the circuit 106 may be configured to generate a maximum value from among the input values 111 of a particular range. The accumulator/max circuit may be configured to store the running maximum value which may be eventually output as the output value 131.

Although using the circuit 106d has been used as an example of a circuit 106 configured to perform pooling, in other embodiments, different circuits 106 may be used. For example, the circuit 106a of FIG. 2 may be used where the values stored in the memory 114 may be an identical value for all associated input values 111. Thus, the product 113 will be either the input value 111 scaled by the identical value. When summed in the accumulator 110, the final value 115 may be the sum of the input values 111 scaled by the identical value.

Although particular functions have been used as examples of pooling functions, other polling functions may be used as desired.

Figure 6:
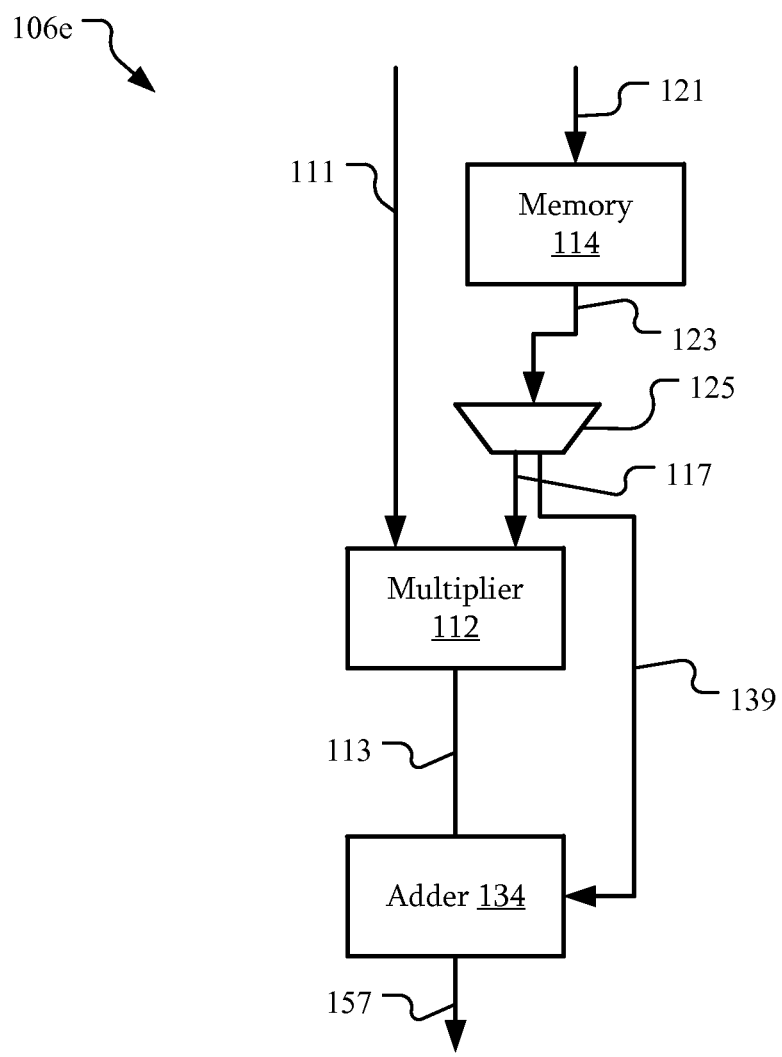

Referring to FIG. 6, in this embodiment, the circuit 106e may include a memory 114, multiplier 112, and multiplexer 125 similar to the circuit 106c of FIG. 4. However, in this embodiment, the multiplexer 125 is configured to also output a second value 139 selected from the values 123 from the memory 114. Although two values 117 and 139 are illustrated as being selected from the memory 114, any number of values may be selected. The value 117 is multiplied by the input value 111. The product 113 may be added with the value 139 in an adder 134 to generate the output value 157. Although only a multiplier 112 and an adder 134 have been used as examples, other components may be present to perform operations on the value 111, values stored in the memory 114, other intermediate values, or the like.

Figure 7:
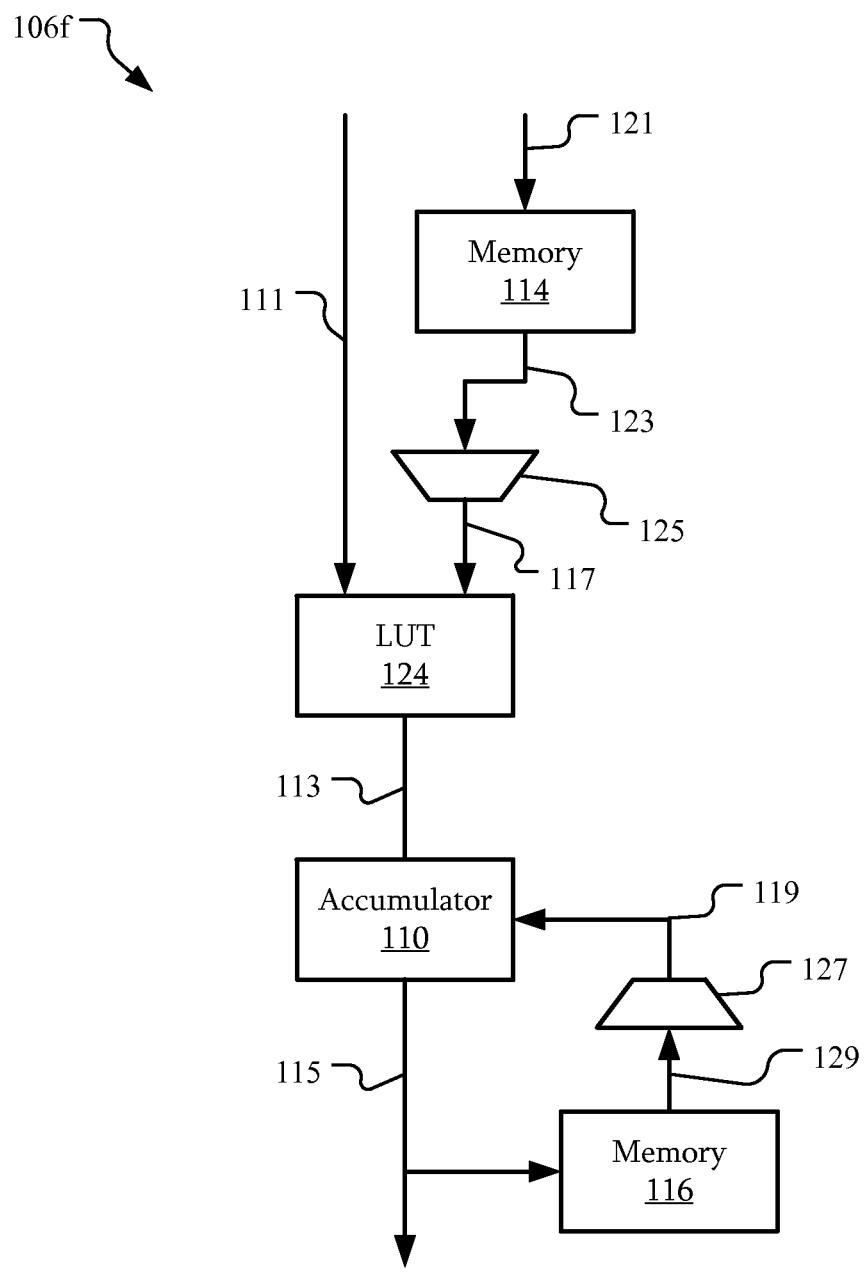

Referring to FIG. 7, in this embodiment, the circuit 106f may include a memory 114, multiplexer 125, accumulator 110, memory 116, and multiplexer 127 similar to the circuit 106c of FIG. 4. However, in this embodiment, the circuit 106f includes a look-up-table (LUT) 124. The LUT 124 may be configured to generate the value 113 in response to the values 111 and 117. For example, the LUT 124 may be configured to store values that, when addressed by the values 111 and 117, form the product of the values 111 and 117. That is, the LUT 124 may be configured to store values that perform a multiplication function on the values 111 and 117. In other embodiments, the LUT 124 may be configured to store values that represent other functions, including non-linear functions, minimum/maximum functions, or the like.

Accordingly, in various embodiments, the circuit 106*f* may be configured to perform a variety of functions, such as, multiply-and-accumulate and other arithmetical operations. In a particular embodiment, the circuit 106*f* may be used in a neural network. For example, the values 111 may be neuron signals. The values stored in the memory 114 may be weights to be applied to the neuron signals. The memory 114 may be configured with sufficient storage space to store the weights for a convolution operation. The LUT 124 may be configured to perform the multiplication. The accumulator 110 may be configured to compute a running sum. The memory 116 may be configured to cache partially computed running sums and load those partial sums into the accumulator 110 when associated values 111 are input.

In an embodiment, different resolutions for values may be used within the circuit 106*f*. For example, the value 111 may have a resolution of 8 bits. However, the memory 114 may be configured to store 4-bit values. Thus, the value 117 may be a 4-bit value. Using multiplication as an example, the LUT 124 may be configured to multiply the higher resolution value 111 with the lower resolution value 117. Although the lower resolution value 117 may have fewer bits, the value 117 may not be limited to a particular range of values. In other words, the value represented by a 4-bit signed number may not be limited to +/−7. In particular, values may be encoded in any manner. When the encoded value 117 is input to the LUT 124, the LUT 124 may be configured to store values that when output as the value 115 represent the function using the decoded value. For example, 0010b may represent a value of 20. The LUT 124 may store values that, when addressed in part by 0010b as the value 117, the output value 115 is the value 111 multiplied by 20. Furthermore, the values of the memory 114 may not be encoded in a linear fashion. For example, 0010b may represent 20 while 0100b represents 100. Although multiplication has been used as an example, as described herein, any function may be performed, including non-linear functions and completely arbitrary functions. Furthermore, in an embodiment, the LUT 124 may be programmable. Thus, the LUT 124 may be reprogrammed to perform different functions as desired. For example, the LUT 124 may be configured to operate in a different mode where values may be written to the LUT 124.

Using lower resolution values may reduce power consumption. In particular, using lower resolution values may reduce the power consumed when using a full resolution multiplier or other fixed function element. Moreover, using the LUT 124 may further reduce the power consumption. Because the resolutions may be reduced, the LUT 124 may use less memory to store values than a LUT 124 using full resolution values.

In an embodiment, various different resolutions may be used within the circuit 106*f*. For example, the value 111 may have a resolution of 8 bits and the value 117 may have a resolution of 4 bits. The output of the LUT 124, value 113, may have a resolution of 12 bits. The output value 115 of the accumulator 110, values stored in the memory 116 and output as value 119 may have a resolution of 14 bits. Accordingly, the output resolution of the circuit 106*f* may be greater than the input resolution of the individual values 111. Although particular numbers of bits for the resolutions of the values have been used as examples, the numbers of bits for the values may be different. Moreover, resolutions that are the same may be different and vice versa.

Although different resolutions for values has been described with respect to circuit 106*f*, different resolutions for values may be used in other circuits 106. Moreover, although some circuits 106 may use lower resolutions, other circuits 106 within the same system may use higher and/or full resolution values.

Figure 8:
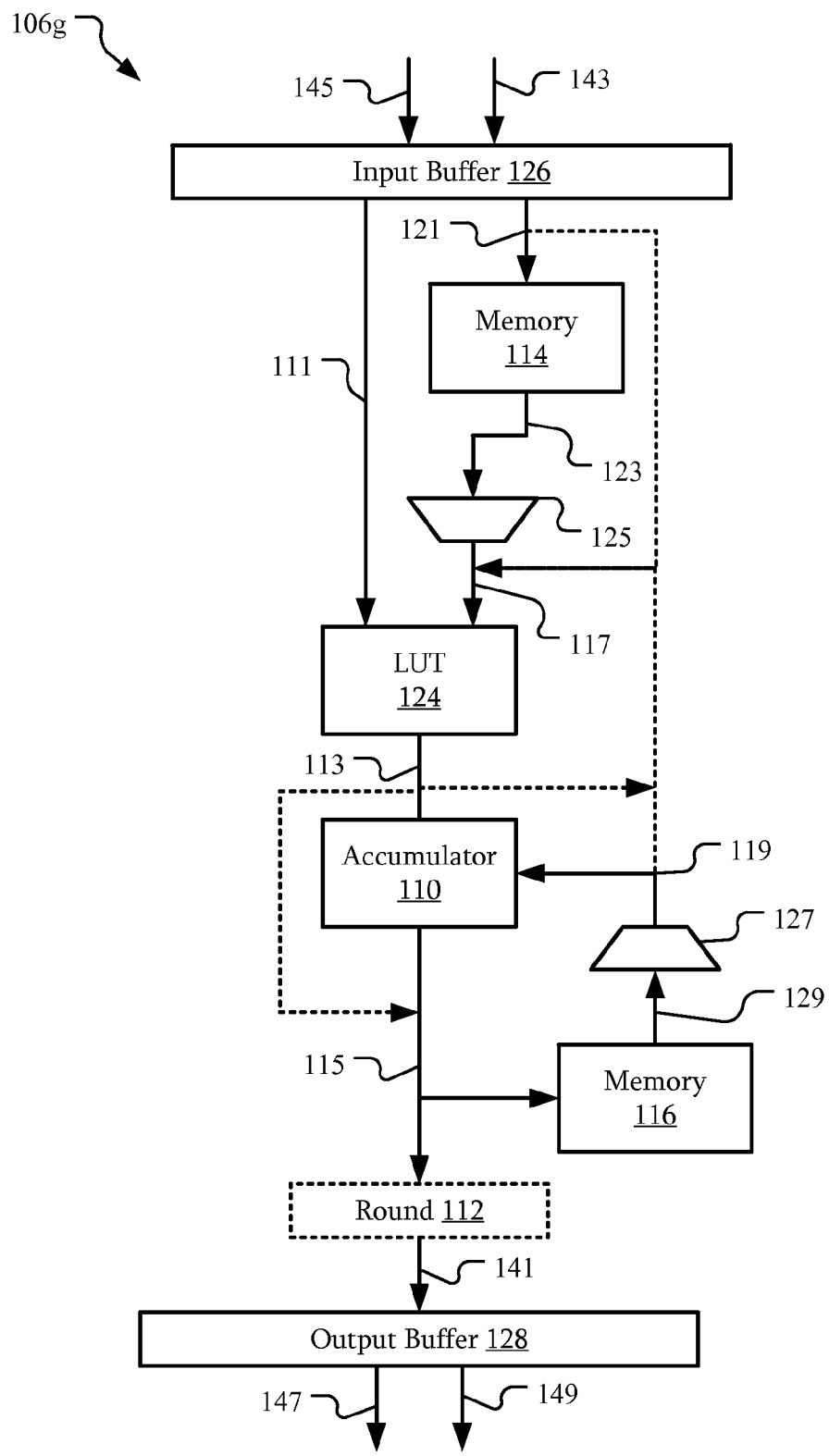

Referring to FIG. 8, in this embodiment, the circuit 106*g* may be similar to the circuit 106*f* of FIG. 7. However, the circuit 106*g* includes an input buffer 126 and an output buffer 128. The input buffer 126 may be configured to receive inputs 143 and 145 from a bus or other communication interface. Two inputs 143 and 145 are illustrated; however, the input buffer 126 may include any number of inputs. The input buffer 126 may be configured to buffer values that will be used as the value 111, stored in the memory 114, stored in the LUT 124, or the like.

In an embodiment, the accumulator 110 may be bypassed. Accordingly, the output value 113 from the LUT 124 may be used as the output value 115. In addition, the output value 113 may be used as the input value 117 or stored in the memory 114. Dashed lines represent these alternate paths.

In an embodiment, the value 119 selected from the memory 116 may be provided to different portions of the circuit 106*g* in addition to the accumulator 110. For example, the value 119 may be used as an input to the LUT 124. In another example, the value 121 from the input buffer 126 may be used as the input value 117 to the LUT 124.

In an embodiment, with such additional paths, different operations may be performed. For example, to implement a pooling operation that finds the maximum value, the LUT 124 may be configured to compare the values 111 and 117 and output the maximum value as the value 113. Rather than adding this value 113 to a running sum in the accumulator 110, the value 113, representing the current maximum value, may be routed to the input of the LUT 124 as value 117. Alternatively, the accumulator 110 may be bypassed and the value 113 used as the value 115. If the current value is not the last value to contribute to a particular pooling operation, that value may be stored in the memory 116 and provided to the LUT 124 when the associated values 111 are input to the circuit 106*g*. Although a pooling operation has been used as an example, other rerouting of the values within the circuit 106*g* may be performed to implement other functions as desired.

In an embodiment, the circuit 106*g* may include a rounding circuit 112. The rounding circuit 112 may be configured to optionally reduce the resolution of the value 115. That is, the rounding circuit 112 may be configured to round the value 115 to generate a value 141 having a reduced resolution. However, the rounding circuit 112 need not reduce the resolution and/or need not be used.

The value 141 may have a particular resolution. The output buffer 128 may be configured to output the value 141 as one or more of the values 147 and 149. In a particular embodiment, the output buffer 128 may be configured to divide the value 141 into a lower precision value 147 with an optional value 149 having additional precision. For example, the value 141 may have a 16 bit width. Each of the values 147 and 149 may have an 8-bit width. Value 147 may be the more significant bits of the value 141 while the value 149 may be the less significant bits of the value 141. Accordingly, if additional precision is desired, both the values 147 and 149 may be used for the full precision.

Figure 9:
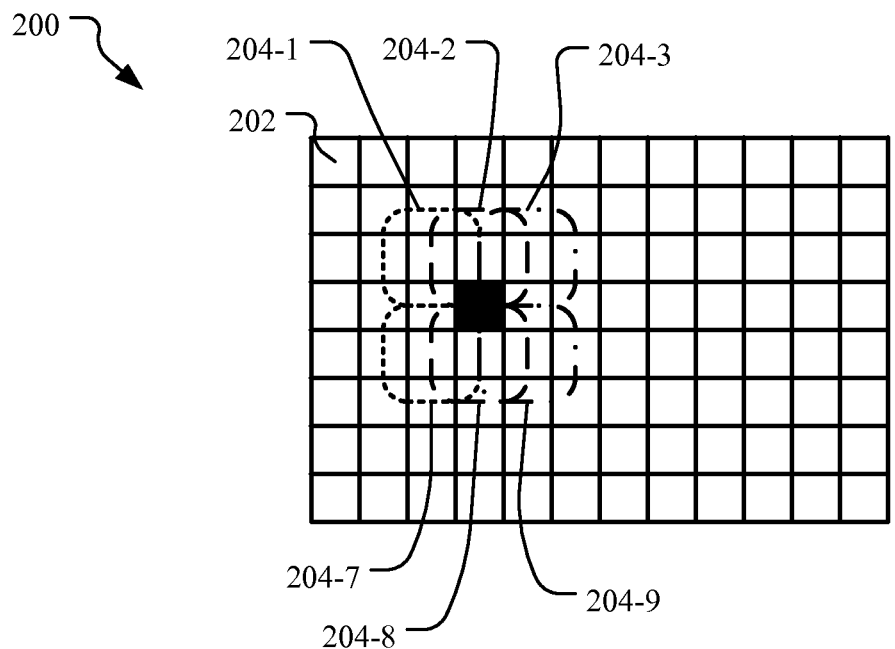
FIGS. 9-13 are schematic views illustrating calculations performed by circuits according to various embodiments.

FIGS. 9-13 are schematic views illustrating calculations performed by circuits according to various embodiments. Referring to FIGS. 1A, 1B, and 9, in this embodiment, nine circuits 106, each configured to act as convolutional multiply and accumulate circuits, are used to process an image 200 formed of pixels 202. The dashed lines represent the convolutional kernel 204 of the circuits 106. Only six of the nine kernels 204-1 to 204-9 are illustrated for clarity. The additional row of kernels 204-4 to 204-6 would be between the illustrated rows of kernels 204.

Here, the black pixel 202 represents the pixel 202 being streamed to each of the nine circuits 106 as the value 111. In each circuit 106, the value 111 representing the pixel 202 is multiplied by a weight corresponding to the position of that pixel 202 in the kernel 204 associated with the circuit 106.

In an embodiment, the pixels 202 may be streamed in a raster fashion. Thus, the three rows above the black pixel and the three pixels before the black pixel 202 have already been processed by the circuits 106. For kernel 204-1, the black pixel 202 is the last pixel of the kernel. Accordingly, the final value may be output from the corresponding circuit 106. For kernels 204-4 and 204-7, the black pixel is the last pixel of the row. Accordingly, the partial sum from the accumulator 110 may be stored in the memory 116. In addition, a partial sum may be loaded from the memory 116 into the accumulator 110 to be ready for the next calculation, which will be described in further detail with respect to FIG. 10. For kernels 204-2, 204-3, 204-5, 204-6, and 204-8, the value from the pixel may be multiplied and accumulated. Because the next value from the next pixel will still be within the kernels 204-2, 204-3, 204-5, 204-6, and 204-8, the circuit 106 need not be reconfigured. For kernel 204-9, the black pixel is the first pixel of the kernel 204-9. Accordingly, the accumulator 110 may be initialized with a value of zero. The product of the value of the pixel 202 and the corresponding weight may be added to the accumulator 110.

Figure 10:
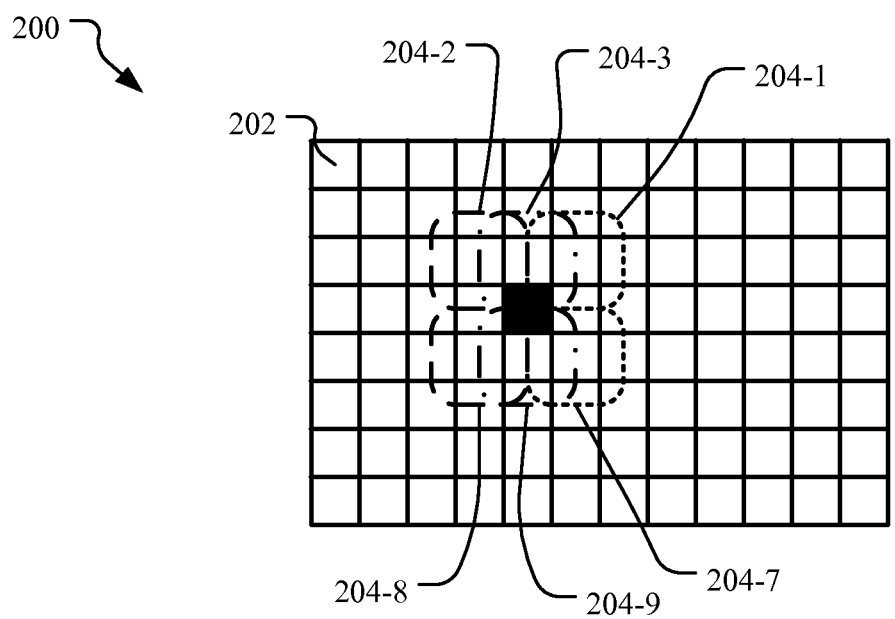

Referring to FIGS. 1A, 1B, and 10, the next pixel is streamed to the circuits 106. Here, circuits 106 associated with kernels 204-2, 204-3, 204-5, 204-6, 204-8, and 204-9 may perform similar to the similarly situated kernels of FIG. 9. However, for circuits 106 associated with kernels 204-1, 204-4, and 204-7, those circuits 106 are now being used to calculate a convolution for a different set of pixels 202. For kernels 204-1 and 204-4, the kernels are in the middle of calculating the final value. A stored value is read from memory 116 corresponding to the running sum for previous pixels in the kernels 204-1 and 204-4. However, for kernel 204-7 the new black pixel of FIG. 10 is the first pixel for that kernel. Thus, the accumulator 110 may be reset to zero.

In a fashion similar to that illustrated in FIGS. 9 and 10, when a new pixel of the same row is streamed to the circuits 106, the circuits 106 associated with the trailing kernels 204 for the previous pixel will output a value or cache a partial sum and begin calculation on a new sum or load a partial sum corresponding to a kernel 204 on the leading edge. In the change from FIG. 9 to FIG. 10, circuits 106 associated with kernels 204-1, 204-4, and 204-7 are reconfigured to calculate the sum based on a different set of pixels. Similarly, when the operations in FIG. 10 are complete, circuits 106 associated with kernels 204-2, 204-5, and 204-8 will change to process pixels on the leading edge.

Similarly, when a pixel 202 of a new row is streamed to the circuits 106, rather than circuits 106 associated with kernels 204 on the trailing edge in the row direction being the circuits 106 that are changed to calculate using a different set of pixels 202, circuits 106 associated with kernels 204 on the trailing edge in the column direction are changed to calculate using the different set of pixels 202. For example, once the last pixel of the row including the black pixels of FIGS. 9 and 10 is streamed to the circuits, circuits 106 associated with kernels 204-1, 204-2, and 204-3 are reconfigured to begin processing pixels 202 on the next row.

In this example, a kernel with a size of 3×3 was used as an example. However, in other embodiments, kernels 204 having different sizes may be used.

In an embodiment, a number of circuits 106 configured to calculate values for a convolution may be equal to the number of pixels 202 within a kernel 204. In the example, above, nine circuits 106 were used, corresponding to the 3×3 kernel. However, in other embodiments, different number of circuits 106 may be used. In particular, any number of circuits 106 greater than one may be used. For a K×K kernel 204, $K^2$ circuits 106 may be used. Using this amount of circuits 106 may allow a convolution to be performed in a single pass. In other embodiments, fewer circuits 106 may be used. If fewer circuits 106 are used, an image may be subdivided into parts. In addition, or alternatively, multiple passes may be used. Furthermore, more circuits 106 may be used. For example, $N \times K^2$ circuits 106 may be used. The image may be divided into N segments, which may be processed in parallel and merged after calculation.

In an embodiment, a size of the memory 116 may be based on an expected image and a kernel 204 size. For example, the size of the memory 116 may be selected to be greater than or equal to a width of the expected image divided by the width of a kernel 204, with the result rounded up. If the input image is too wide and the accumulator cache size is insufficient to process such a wide image, the image can be split vertically into several sub-images, each having width suitable for the accumulator cache size. Each input sub-image can be input into the circuits 106 in raster fashion for convolution processing. The raster outputs from the circuits 106 can be saved into the memory 102 in a manner such that the output sub-images form a single output convolved image as if it was never split during processing.

Figure 11:
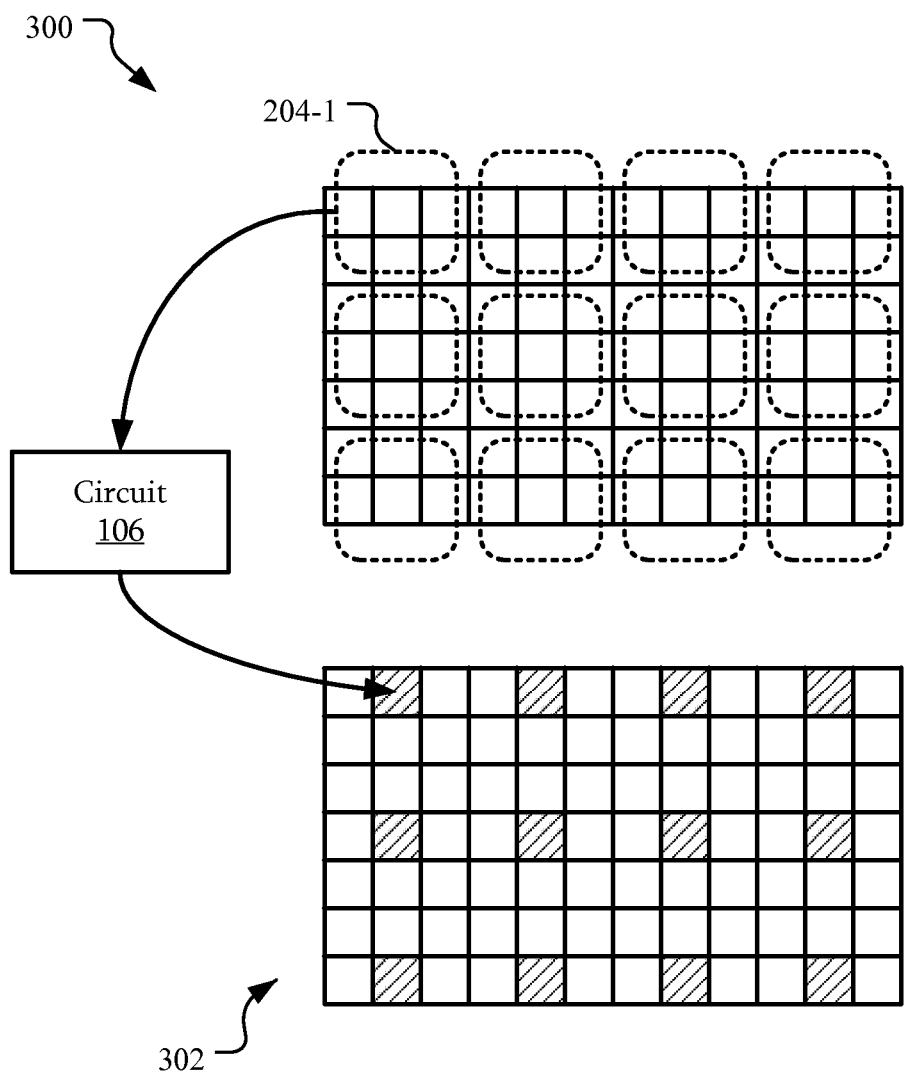

Referring to FIG. 11, the pixels of an image 300 that one particular circuit 106 may process. In particular, each dashed area represents the pixels of the image 300 that the circuit 106 processes. The arrows illustrate an association of the pixels of the image 300 and the individual value of the convolution result in image 302. As illustrated, this circuit 106 only calculates a portion of the image 302.

Figure 12:
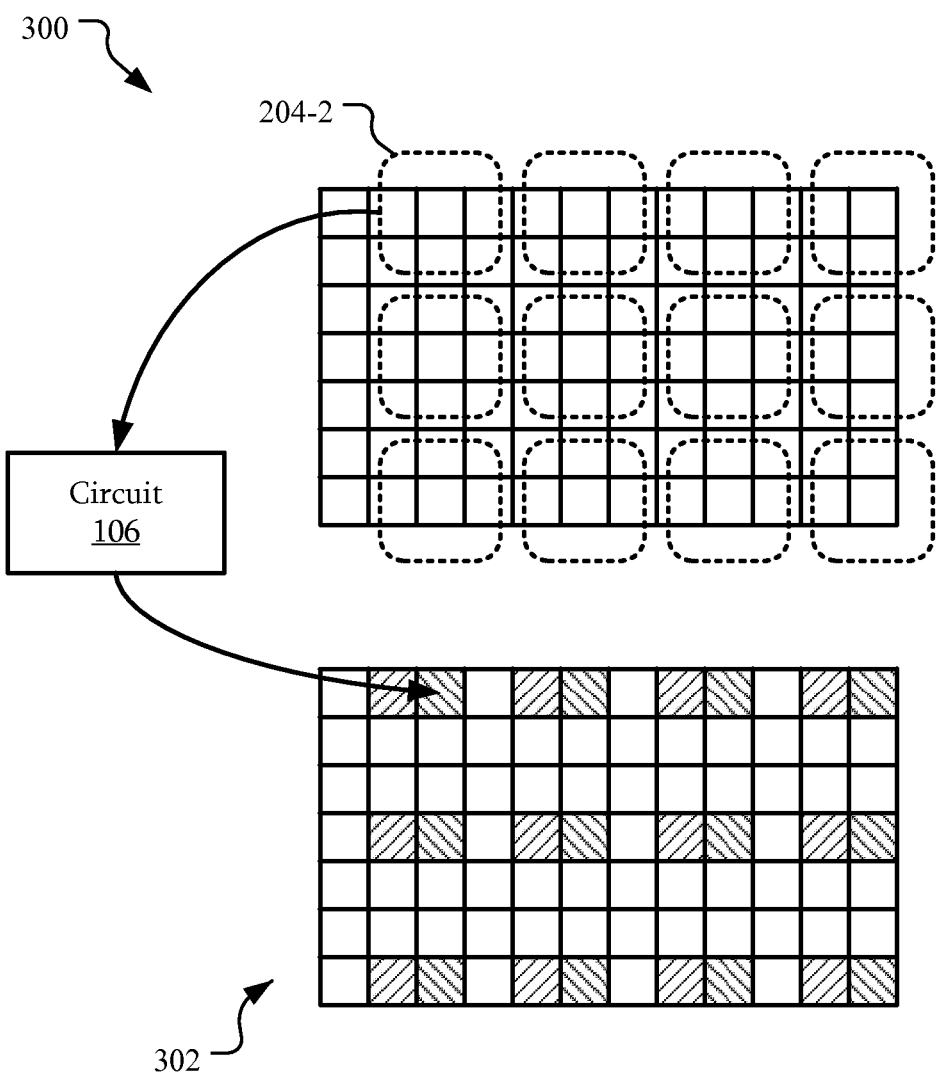

Referring to FIG. 12, another circuit 106 calculates a different portion of the image 302 using different sets of pixels of the image 300. That is, the kernel 204-2 is one pixel offset from the kernel 204-1 of FIG. 11. Thus, the resulting pixel in the image 302 is one pixel offset.

In an embodiment, if the inputs to the circuits 106 are streamed in raster order, the outputs from the circuits 106 may also be output in raster order. For example, referring back to FIG. 9, after the calculation using the black pixel is performed, the convolution using kernel 204-1 is finished. The result may be output. In the next stage illustrated in FIG. 10, the convolution using the kernel 204-2 is finished and that result may be output. Accordingly, after an initial delay, such as the delay in this example to process two rows and one or more pixels, the convolution result may begin streaming from the circuits 106. This result may be streamed to other circuits 106 for additional processing.

Figure 13:
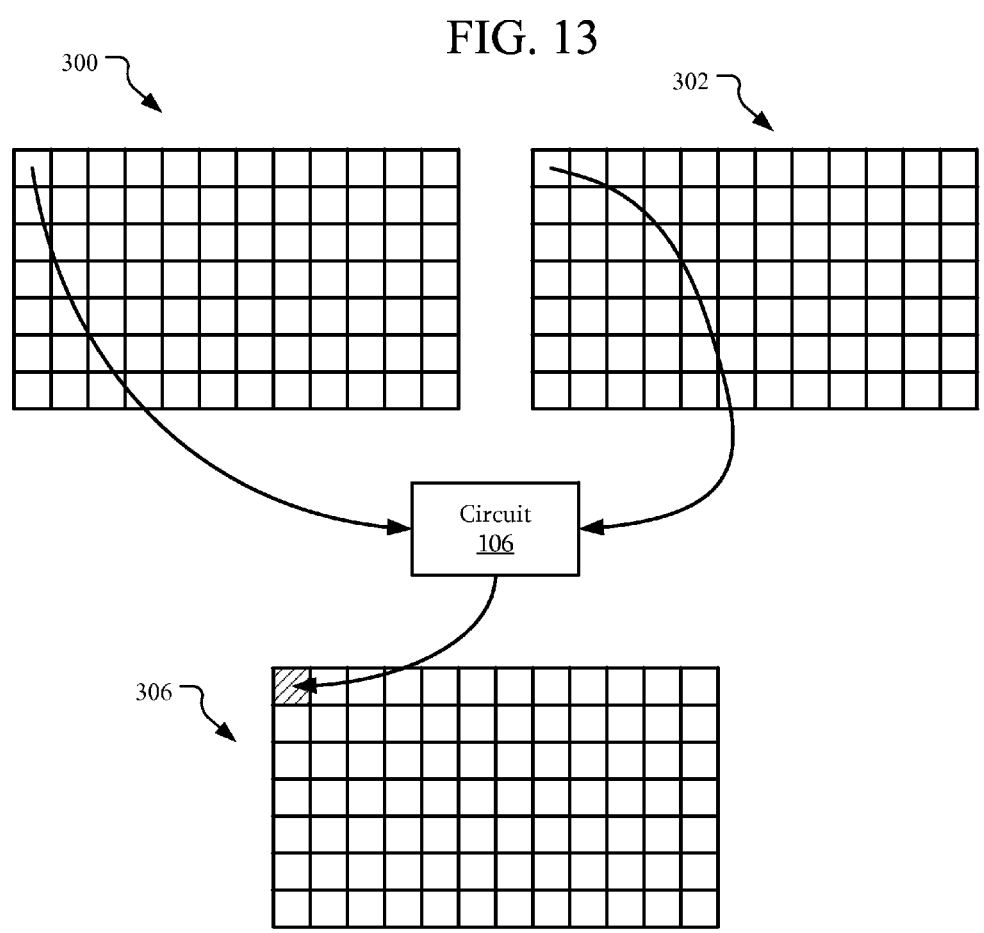

Referring to FIG. 13, in this embodiment, two or more images, such as images 300 and 302 may be streamed to a circuit 106. The circuit 106 may be configured to perform a function based on the pixels from the images 300 and 302. Referring to FIG. 7 as an example, in some embodiments, an additional input may be supplied to the LUT 124. In other embodiments, an additional input may be passed through the memory 114, bypass the memory 114, or the like to be used as the value 117. Although one additional input has been used as an example, any number of such inputs may be used.

Figure 14:
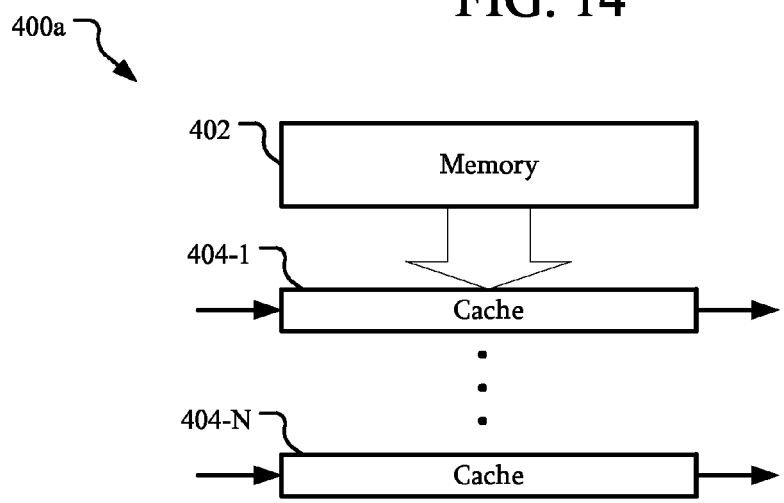
FIGS. 14-16 are schematic views of memory systems according to various embodiments.
Figure 15:
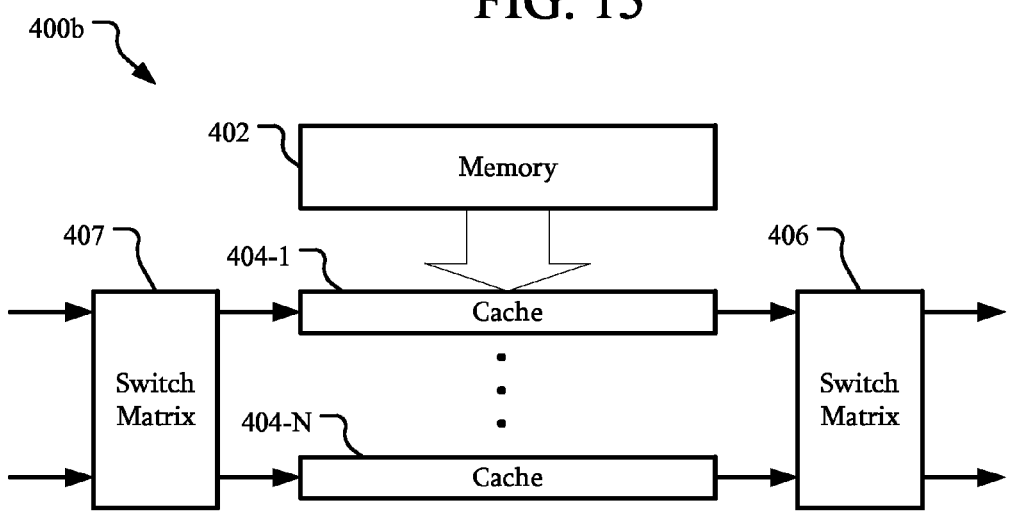
Figure 16:
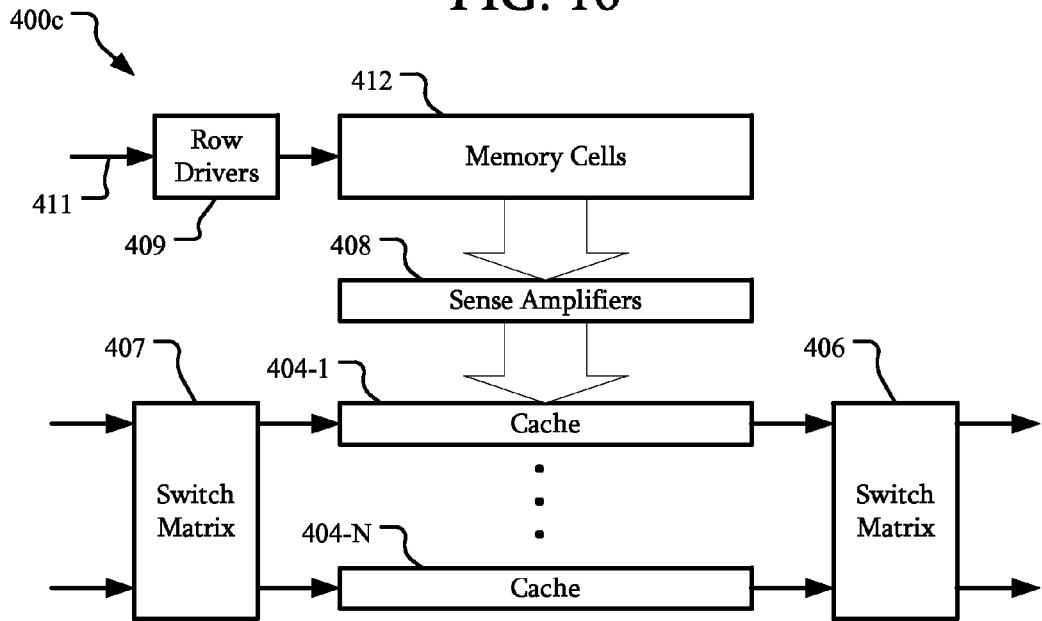

FIGS. 14-16 are schematic views of memory systems according to various embodiments. Referring to FIG. 14, in this embodiment, a memory system 400a may include a memory 402 configured to store data. Additional memories are coupled to the memory 402. These memories are labeled as caches 404 to distinguish from the memory 402 for the sake of clarity; however, the caches 404 may, but need not be similar to the memory 402.

Each cache 404 is configured to cache a portion of the data of the memory 402 including multiple values. For example, each cache 404 may be configured to cache a row of the memory 402. The cached values may then be output in multiple streams. As there are N caches 404 in this example, N streams may be output from the memory system 400.

In particular, some memories may be designed such that an entire portion is read out even to read a single value. Reading the entire portion for each single value may lead to increased power consumption. Since in convolution and matrix operations memory buffers are accessed sequentially, in raster order, where the next access address equals the previous access address plus one, caching data retrieved from a portion allows accessing the portion only once for the values within that portion. This may result in power savings. Similarly, data may be cached in the caches 404 before the portion is written to the memory 402. Such caching may again result in power savings. In particular, as the results from convolution and/or matrix operations may be returned in a raster format, the results may be streamed into the caches 404 and, when a cache 404 is full, it may be written to the memory 402.

A cache 404 may be configured to have a size sufficient to store that portion. Thus, when streaming out the data of that portion, the portion need not be read multiple times for each value of the stream. In contrast, once the portion is cached in the cache 404, the values may be streamed out of the cache. Thus, the portion of the memory 402 was only read once.

In a particular embodiment, the memory system 400 may be used to deliver a number of parallel streams to convolve multiple maps, where each map may be computed from a number of input maps located in a previous layer. Due to possibly many concurrent streams, power consumption can be reduced by using embedded memory instead of external DRAM since external DRAM consumes considerable I/O power.

Referring to FIG. 15, the memory system 400b may be similar to the memory system 400a of FIG. 14. However, in this embodiment, the memory system 400b includes switch matrices 406 and 407. The matrices 406 and 407 may be part of the switch 103 of FIG. 1B. The matrix 406 may be configured to switch a stream output from a given cache 404 to a particular bus coupled to the circuits 106. Similarly, the matrix 407 may be configured to switch a stream on a particular bus to a particular cache 404.

Referring to FIG. 16, the memory system, 400c may be similar to the memory system 400b of FIG. 15. However, in this embodiment, the memory system 400c includes memory cells 412, sense amplifiers 408 and row drivers 409. The row driver 409 is configured to select a row of the memory cells 402 to be read or written in response to a row address 411. The sense amplifiers 408 are configured to read and write a row of data to the memory cells 402. Accordingly, then a row is read into one of the caches 404, the row need not be read again when streaming the data of the row to the circuits 106.

In an embodiment, a number of the caches 404 may be the same as the number of input and/or output busses. Thus, the switches 406 and 407 may be configured to route a stream from the caches 404 to one of the busses on a one-to-one basis. However, in other embodiments, the number of caches 404 may be different from and/or unrelated to the number of busses.

Figure 17:
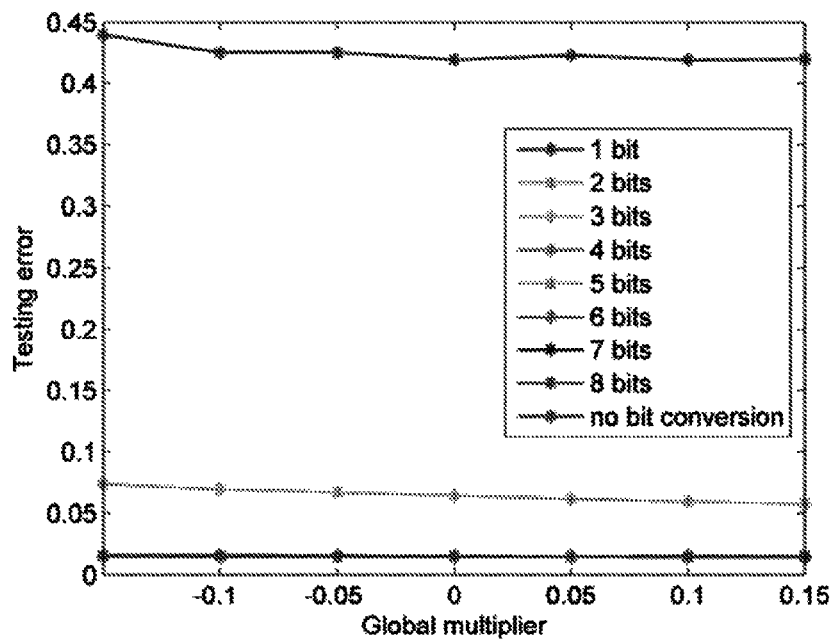
FIG. 17 is a chart illustrating a result of different resolutions for weights according to an embodiment.

FIG. 17 is a chart illustrating a result of different resolutions for weights according to an embodiment. Various different weight resolutions are illustrated. The 1-bit resolution had the highest testing error. The 2-bit resolution had a lower testing error. The higher resolutions had testing errors that overlap in the chart near zero testing error.

Figure 18:
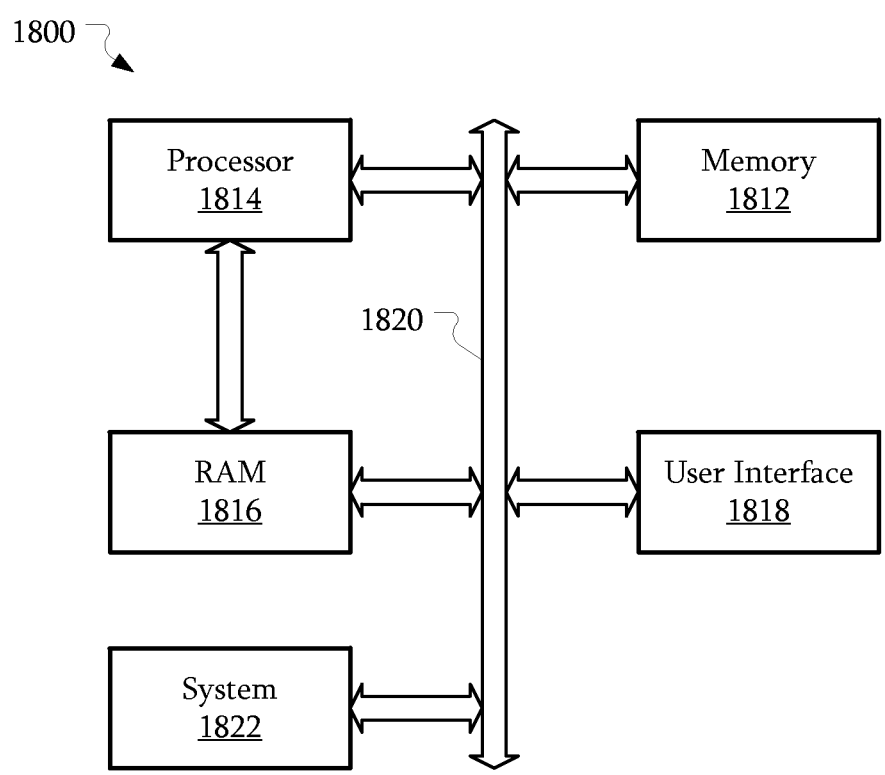
FIG. 18 is a schematic view of an electronic system which may include a system according to an embodiment.

FIG. 18 is a schematic view of an electronic system which may include a system according to an embodiment. The electronic system 1800 may be part of a wide variety of electronic devices including, but not limited to portable notebook computers, Ultra-Mobile PCs (UMPC), Tablet PCs, servers, workstations, mobile telecommunication devices, and so on. Moreover, the electronic system 1800 may be implemented in part using a system-on-chip architecture. For example, the electronic system 1800 may include a memory system 1812, a processor 1814, RAM 1816, a user interface 1818, and a system 1822. The components of the electronic system 1800 may be configured to communicate using a bus 1820. The system 1822 may be a system as described above.

The processor 1814 may be a microprocessor or a mobile processor (AP). The processor 1814 may have a processor core (not illustrated) that can include a floating point unit (FPU), an arithmetic logic unit (ALU), a graphics processing unit (GPU), and a digital signal processing core (DSP Core), or any combinations thereof. The processor 1814 may execute the program and control the electronic system 1800.

The RAM 1816 may be used as an operation memory of the processor 1814. Alternatively, the processor 1814 and the RAM 1816 may be packaged in a single package body. In an embodiment, the RAM 1816 may be the memory 102 described above; however, in other embodiments the memory 102 ad the RAM 1816 may be separate.

The user interface 1818 may be used in inputting/outputting data to/from the electronic system 1800. For example, the user interface 1818 may include video input devices, audio input devices, or the like. Data from such devices may be stored in memory associated with the system 1822. Thus, audio and visual signals may be processed as described above.

The memory system 1812 may be configured to store codes for operating the processor 1814, data processed by the processor 1814, or externally input data. The memory system 1812 may include a controller and a memory. The memory system may include an interface to computer readable media. Such computer readable media may store instructions to perform the variety of operations describe above.

Although the structures, methods, and systems have been described in accordance with exemplary embodiments, one of ordinary skill in the art will readily recognize that many variations to the disclosed embodiments are possible, and any variations should therefore be considered to be within the spirit and scope of the apparatus, method, and system disclosed herein. Accordingly, many modifications may be made by one of ordinary skill in the art without departing from the spirit and scope of the appended claims.

The invention claimed is:

1. A system, comprising:
a first memory;
a plurality of first circuits, wherein each first circuit:
is coupled to the memory; and includes:
a second circuit configured to generate a first output value in response to an input value received from the first memory and including a look-up-table configured to output the first output value in response to the input value; and
an accumulator configured to receive the first output value and generate a second output value; and
a controller coupled to the memory and the first circuits, and configured to determine the input values to be transmitted from the memory to the first circuits;
wherein each first circuit further comprises:
a second memory configured to store second input values;
a first multiplexer configured to select a second input value from the second input values stored in the second memory;
a third memory configured to store second output values from the accumulator; and
a second multiplexer configured to select a stored second output value from the third memory;
wherein:
the accumulator is configured to load the selected stored second output value from the second multiplexer; and
the look-up-table is configured to output the first output value in response to the selected second input value from the first multiplexer.

2. The system of claim 1, wherein for each first circuit, the look-up table is configured as a multiplier configured to multiply the input value by a second input value.

3. The system of claim 2, wherein:
each first circuit further comprises a second memory; and
the look-up table is configured to receive the second input value from the second memory.

4. The system of claim 3, wherein a resolution of the input values to the multiplier are different.

5. The system of claim 2, wherein:
each first circuit further comprises a second memory; and
the accumulator is configured to load a value from the second memory and add the first output value.

6. The system of claim 5, wherein the controller is configured to cause each first circuit to load the accumulator with the value from the second memory before completing a multiply-and-accumulate operation of a convolution.

7. The system of claim 1, wherein a resolution of the second output value is greater than a resolution of the input value.

8. The system of claim 1, further comprising a plurality of third circuits, each third circuit comprising:
an accumulator configured to receive an input value from the first memory; and
a second memory configured to store a value from accumulator.

9. The system of claim 1, wherein:
the first memory is configured to output a plurality of outputs substantially simultaneously; and
the system further comprises a switch coupled between the first memory and the first circuits and configured to route the outputs from the memory to the first circuits.

10. The system of claim 9, wherein the controller is configured to cause the switch to route a value from the first memory to more than one of the first circuits.

11. The system of claim 9, wherein the controller is configured to cause the switch to route a value from one of the first circuits to at least one other first circuit of the first circuits.

12. The system of claim 9, wherein the controller is configured to cause the switch to route a plurality of values from the first memory to each of the first circuits substantially simultaneously.

13. A system, comprising:
a first memory;
a plurality of first circuits, wherein each first circuit:
is coupled to the memory; and
includes:
a second circuit configured to generate a first output value in response to an input value received from the first memory and including a look-up-table configured to output the first output value in response to the input value; and
an accumulator configured to receive the first output value and generate a second output value; and
a controller coupled to the memory and the first circuits, and configured to determine the input values to be transmitted from the memory to the first circuits;
wherein:
the first memory is configured to output a plurality of outputs substantially simultaneously; and
the system further comprises a switch coupled between the first memory and the first circuits and configured to route the outputs from the memory to the first circuits.

14. The system of claim 13, wherein the controller is configured to cause the switch to route a value from the first memory to more than one of the first circuits.

15. The system of claim 13, wherein the controller is configured to cause the switch to route a value from one of the first circuits to at least one other first circuit of the first circuits.

16. The system of claim 13, wherein the controller is configured to cause the switch to route a plurality of values from the first memory to each of the first circuits substantially simultaneously.

* * * * *